(12) United States Patent
Forbes

(10) Patent No.: US 7,973,370 B2
(45) Date of Patent: Jul. 5, 2011

(54) FULLY DEPLETED SILICON-ON-INSULATOR CMOS LOGIC

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 620 days.

(21) Appl. No.: 11/391,087

(22) Filed: Mar. 28, 2006

(65) Prior Publication Data

US 2006/0170050 A1 Aug. 3, 2006

Related U.S. Application Data

(60) Continuation of application No. 10/950,726, filed on Sep. 27, 2004, now Pat. No. 7,078,770, which is a division of application No. 10/682,590, filed on Oct. 9, 2003, now Pat. No. 6,830,963.

(51) Int. Cl.
   *H01L 31/119* (2006.01)
(52) U.S. Cl. ......... 257/392; 257/347; 257/476; 257/548
(58) Field of Classification Search .................. 257/347, 257/476, 548, 392
   See application file for complete search history.

(56) References Cited

U.S. PATENT DOCUMENTS

| | | |
|---|---|---|
| 4,184,207 A | 1/1980 | McElroy |
| 4,420,504 A | 12/1983 | Cooper |
| 4,755,864 A | 7/1988 | Ariizumi |
| 4,881,114 A | 11/1989 | Mohsen |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |
| 5,397,725 A | 3/1995 | Wolstenholme |
| 5,467,305 A | 11/1995 | Bertin |
| 5,576,236 A | 11/1996 | Chang |
| 5,768,192 A | 6/1998 | Eitan |
| 5,792,697 A | 8/1998 | Wen |
| 5,858,841 A | 1/1999 | Hsu |
| 5,911,106 A | 6/1999 | Tasaka |
| 5,942,781 A | 8/1999 | Burr |
| 5,946,558 A | 8/1999 | Hsu |
| 5,966,603 A | 10/1999 | Eitan |
| 5,994,745 A | 11/1999 | Hong |
| 6,011,725 A | 1/2000 | Eitan |

(Continued)

FOREIGN PATENT DOCUMENTS

EP  84303740.9  1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner* — Samuel A Gebremariam
(74) *Attorney, Agent, or Firm* — Leffert Jay & Polglaze, P.A.

(57) ABSTRACT

A extractor implanted region is used in a silicon-on-insulator CMOS memory device. The extractor region is reversed biased to remove minority carriers from the body region of partially depleted memory cells. This causes the body region to be fully depleted without the adverse floating body effects.

10 Claims, 5 Drawing Sheets

U.S. PATENT DOCUMENTS

| | | | |
|---|---|---|---|
| 6,028,342 A | 2/2000 | Chang | |
| 6,030,871 A | 2/2000 | Eitan | |
| 6,044,022 A | 3/2000 | Nachumovsky | |
| 6,078,090 A | 6/2000 | Williams | |
| 6,081,456 A | 6/2000 | Dadashev | |
| 6,108,240 A | 8/2000 | Lavi | |
| 6,133,102 A | 10/2000 | Wu | |
| 6,134,156 A | 10/2000 | Eitan | |
| 6,147,904 A | 11/2000 | Liron | |
| 6,157,570 A | 12/2000 | Nachumovsky | |
| 6,172,396 B1 | 1/2001 | Chang | |
| 6,174,758 B1 | 1/2001 | Nachumovsky | |
| 6,175,523 B1 | 1/2001 | Yang | |
| 6,181,597 B1 | 1/2001 | Nachumovsky | |
| 6,184,089 B1 | 2/2001 | Chang | |
| 6,201,282 B1 | 3/2001 | Eitan | |
| 6,201,737 B1 | 3/2001 | Hollmer | |
| 6,204,529 B1 | 3/2001 | Lung | |
| 6,207,504 B1 | 3/2001 | Hsieh | |
| 6,208,557 B1 | 3/2001 | Bergemont | |
| 6,215,702 B1 | 4/2001 | Derhacobian | |
| 6,218,695 B1 | 4/2001 | Nachumovsky | |
| 6,222,768 B1 | 4/2001 | Hollmer | |
| 6,240,020 B1 | 5/2001 | Yang | |
| 6,243,300 B1 | 6/2001 | Sunkavalli | |
| 6,249,027 B1 | 6/2001 | Burr | |
| 6,251,731 B1 | 6/2001 | Wu | |
| 6,255,166 B1 | 7/2001 | Ogura | |
| 6,256,231 B1 | 7/2001 | Lavi | |
| 6,266,281 B1 | 7/2001 | Derhacobian | |
| 6,269,023 B1 | 7/2001 | Derhacobian | |
| 6,272,043 B1 | 8/2001 | Hollmer | |
| 6,275,414 B1 | 8/2001 | Randolph | |
| 6,282,118 B1 | 8/2001 | Lung | |
| 6,291,854 B1 | 9/2001 | Peng | |
| 6,297,096 B1 | 10/2001 | Boaz | |
| 6,303,436 B1 | 10/2001 | Sung | |
| 6,327,174 B1 | 12/2001 | Jung | |
| 6,348,711 B1 | 2/2002 | Eitan | |
| 6,392,930 B2 | 5/2002 | Jung | |
| 6,406,951 B1 | 6/2002 | Yu | |
| 6,417,053 B1 | 7/2002 | Kuo | |
| 6,421,275 B1 | 7/2002 | Chen | |
| 6,429,063 B1 | 8/2002 | Eitan | |
| 6,432,778 B1 | 8/2002 | Lai | |
| 6,461,949 B1 | 10/2002 | Chang | |
| 6,468,864 B1 | 10/2002 | Sung | |
| 6,469,342 B1 | 10/2002 | Kuo | |
| 6,477,084 B1 | 11/2002 | Eitan | |
| 6,486,028 B1 | 11/2002 | Chang | |
| 6,487,050 B1 | 11/2002 | Liu | |
| 6,498,377 B1 | 12/2002 | Lin | |
| 6,514,831 B1 | 2/2003 | Liu | |
| 6,531,887 B2 | 3/2003 | Sun | |
| 6,537,891 B1 | 3/2003 | Dennison | |
| 6,545,309 B1 | 4/2003 | Kuo | |
| 6,552,387 B1 | 4/2003 | Eitan | |
| 6,559,013 B1 | 5/2003 | Pan | |
| 6,576,511 B2 | 6/2003 | Pan | |
| 6,580,135 B2 | 6/2003 | Chen | |
| 6,580,630 B1 | 6/2003 | Liu | |
| 6,602,805 B2 | 8/2003 | Chang | |
| 6,605,843 B1 | 8/2003 | Krivokapic | |
| 6,607,957 B1 | 8/2003 | Fan | |
| 6,610,586 B1 | 8/2003 | Liu | |
| 6,613,632 B2 | 9/2003 | Liu | |
| 6,617,204 B2 | 9/2003 | Sung | |
| 6,627,505 B2 | 9/2003 | Adan | |
| 6,660,598 B2 | 12/2003 | Hanafi | |
| 6,674,138 B1* | 1/2004 | Halliyal et al. | 257/411 |
| 6,703,684 B2 | 3/2004 | Udrea | |
| 7,078,770 B2* | 7/2006 | Forbes | 257/347 |
| 2001/0001075 A1 | 5/2001 | Ngo | |
| 2001/0004332 A1 | 6/2001 | Eitan | |
| 2001/0011755 A1 | 8/2001 | Tasaka | |
| 2001/0045602 A1* | 11/2001 | Maeda et al. | 257/347 |
| 2002/0027802 A1 | 3/2002 | Noble | |
| 2002/0074569 A1* | 6/2002 | Taniguchi et al. | 257/200 |
| 2002/0142569 A1 | 10/2002 | Chang | |
| 2002/0146885 A1 | 10/2002 | Chen | |
| 2002/0151138 A1 | 10/2002 | Liu | |
| 2002/0177275 A1 | 11/2002 | Liu | |
| 2002/0182829 A1 | 12/2002 | Chen | |
| 2003/0057997 A1 | 3/2003 | Sun | |
| 2003/0067807 A1 | 4/2003 | Lin | |
| 2003/0117861 A1 | 6/2003 | Maayan | |

FOREIGN PATENT DOCUMENTS

| | | |
|---|---|---|
| EP | 90115805.5 | 2/1991 |
| EP | 01113179.4 | 12/2002 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41$^{st}$ Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "E$^2$PROM Product Issues and Technology Trends," IEEE 1989, pp. 17-19, Copyrright 1989 IEEE.

T. Huang, F. Jong, T. Chao, H. Lin, L. Leu, K. Young, C. Lin, K. Chiu, "Improving Radiation Hardness of EEPROM/Flash Cell by $N_2O$ Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide—Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With A TiSi$_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, Date Unknown.

T. Sugizaki, et al. "New 2-bit/Tr MONOS Type Flash Memory using Al$_2$O$_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit *Micro*Flash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40$^{th}$ Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™ —a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., Date Unknown.

L. Breuil, et al., "A new 2 isolated-bits/cell flash memory device with self aligned split gate structure using ONO stacks for charge storage," IMEC, Date Unknown.

J. Willer, et al., "UMEM: A U-shape Non-Volatile-Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge-Trapping Layer," Samsung Electrons Co., Ltd., Date Unknown.

Y. Roizin, et al., "In-Process Charging in *micro*FLASH® Memory Cells," Tower Semiconductor, Ltd., Date Unknown.

A. Shappir, et al., "Subtreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, Date Unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.

Y. Roizin, et al., "Retention Characteristics of *micro*FLASH® Memory (Activation Energy of Traps in the ONO Stack)," Tower Semiconductor, Ltd., Date Unknown.

Y. Roizin, et al., "Activation Energy of Traps in the ONO Stack of *micro*FLASH® Memory Cells," Tower Semiconductor, Ltd., Date Unknown.

Y. Roizin, et al., "'Dummy' Gox for Optimization of *micro*FLASH® Technology," Tower Semiconductor, Ltd., Date Unknown.

Y. K. Lee, et al., "Multi-Level Vertical Channel SONOS Nonvolatile Memory on SOI" 2002 Symposium on VLSI Technology Digest of Technical Papers, Copyright 2002 IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

\* cited by examiner

US 7,973,370 B2

FULLY DEPLETED SILICON-ON-INSULATOR CMOS LOGIC

RELATED APPLICATIONS

This is a continuation of U.S. patent application Ser. No. 10/950,726 filed Sep. 27, 2004 now U.S. Pat. No. 7,078,770, titled "Fully Depleted Silicon-on-Insulator CMOS Logic" (Allowed), which is a divisional application of U.S. patent application Ser. No. 10/682,590 filed Oct. 9, 2003, titled "Fully Depleted Silicon-On-Insulator CMOS Logic" (now U.S. Pat. No. 6,830,963 issued Dec. 14, 2004) and commonly assigned, the entire contents of which is incorporated herein by reference.

TECHNICAL FIELD OF THE INVENTION

The present invention relates generally to silicon-on-insulator devices and in particular the present invention relates to fully depleted silicon-on-insulator logic.

BACKGROUND OF THE INVENTION

The increased speed and capability of computers and other electronic devices requires better performance from the integrated circuits that make up a device. One way to make the integrated circuits faster is to reduce the size of the transistors that make up the device. However, as transistors are made smaller and faster, delays through the connections between the transistors becomes greater in relation to the speed of the transistor.

An alternative technique to speed up integrated circuits is to use alternative semiconductors. For example, silicon-on-insulator (SOI) technology provides a 25-35% performance increase over equivalent CMOS technologies. SOI refers to placing a thin layer of silicon on top of an insulator such as silicon oxide or glass. The transistors would then be built on this thin layer of SOI. The SOI layer reduces the capacitance of the transistors so that they operate faster.

FIG. 1 illustrates a typical SOI semiconductor. The transistor is formed in the silicon layer 101 that is over the insulator 102. The insulator is formed on top of the substrate 103. Within the silicon layer 101, the drain/source regions 105 and 106 are formed. The gate 107 is formed above the partially depleted channel 109. A floating body 110 is within the depleted region 112 and results from the partial depletion.

SOI technology, however, imposes significant technical challenges. The silicon film used for SOI transistors must be perfect crystalline silicon. The insulator layer, however, is not crystalline. It is very difficult to make perfect crystalline silicon-on-oxide or silicon with other insulators since the insulator layer's crystalline properties are so different from the pure silicon. If perfect crystalline silicon is not obtained, defects will find their way onto the SOI film. This degrades the transistor performance.

Additionally, if the p-type body is contacted by implanted regions there will be a very high resistance of the body region, particularly if the transistor is wide. Impact ionization can cause a large current through this resistance and forward bias the body, thus resulting in transients.

One alternative to this floating body effect is the fully depleted silicon-on-sapphire (SOS) semiconductor. This type of semiconductor does not have a partially depleted silicon layer or floating body. However, they can still experience a problem where the drain current does not stay constant as the drain voltage increases when the transistor is in the saturation region of operation. Instead, the current "kinks" up to a higher value. Clearly, the collection of carriers either on a floating body or near the source is undesirable.

For the reasons stated above, and for other reasons stated below which will become apparent to those skilled in the art upon reading and understanding the present specification, there is a need in the art for a way to control adverse floating body effects in partially depleted CMOS devices using SOI technology.

SUMMARY

The above-mentioned problems with adverse floating body effects and other problems are addressed by the present invention and will be understood by reading and studying the following specification.

The present invention encompasses a method for generating a fully depleted body structure in a silicon-on-insulator device. The method provides an extractor contact coupled to the body structure. An extractor voltage is provided such that the extractor contact is reverse biased and minority carriers in the body structure are removed.

Further embodiments of the invention include methods and apparatus of varying scope.

DETAILED DESCRIPTION

Figure 1:
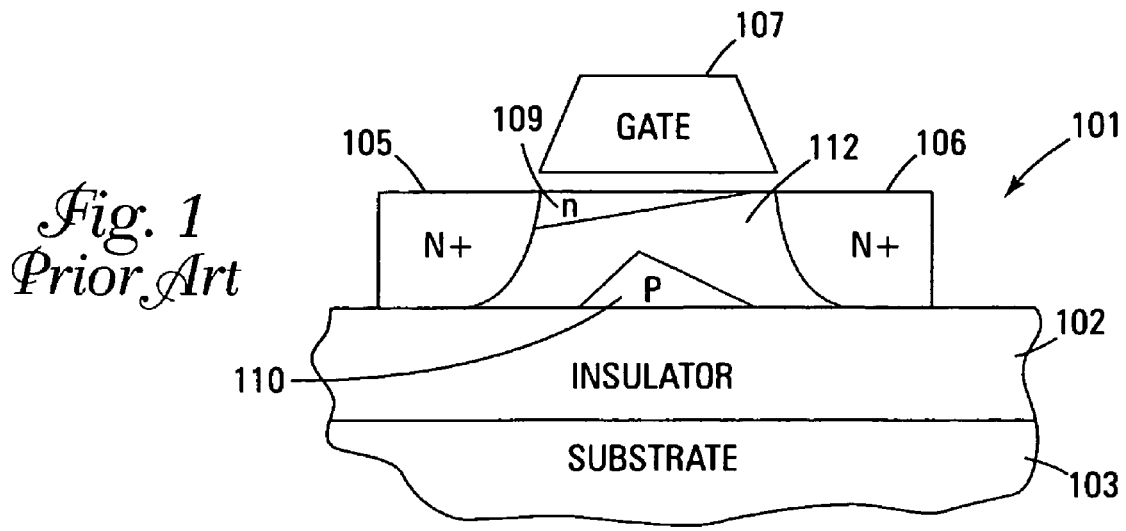
FIG. 1 shows a cross sectional view of a typical silicon-on-insulator transistor.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
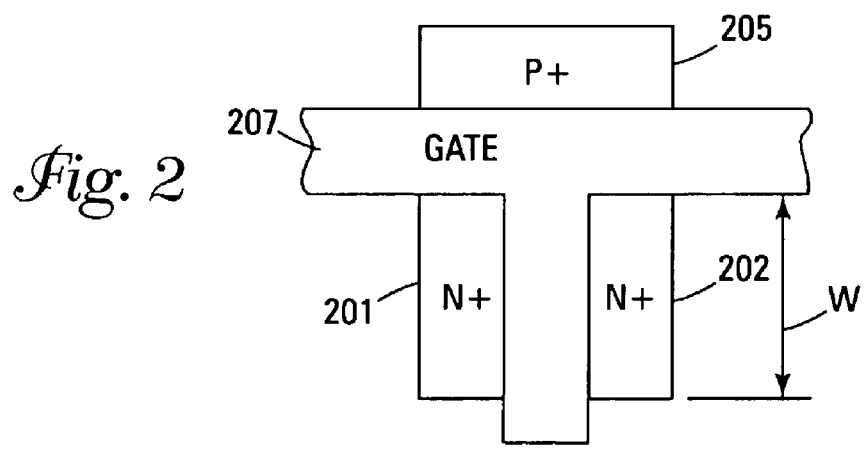
FIG. 2 shows a top view of one embodiment of a silicon-on-insulator transistor of the present invention.

FIG. 2 illustrates a top view of one embodiment of a silicon-on-insulator (SOI) NMOS transistor of the present invention. The present invention uses reverse biasing of the body contacts, also known as extractors, to provide a fully depleted transistor. The extractors remove minority carriers from the body region of a partially depleted MOS device. This eliminates the effect where the drain current does not stay constant as the drain voltage increases when a device is operating in the saturation mode.

The SOI transistor illustrated in FIG. 2 is comprised of two drain/source regions 201 and 202. In one embodiment, these regions are n+ wells formed in the silicon layer. The width of these regions 201 and 202 is indicated as W. In one embodiment, the width is one micron or less. Alternate embodiments use other widths. In another embodiment, transistors wider than one micron can be realized through parallel transistors.

A p+ region extractor contact 205 is formed in the silicon layer substantially adjacent the two drain/source regions 201 and 202. In an alternate embodiment, such as a PMOS device, the extractor contact 205 would be implemented on an n+ silicon region. A gate 207 is formed above and between the drain/source regions 201 and 202.

Figure 3:
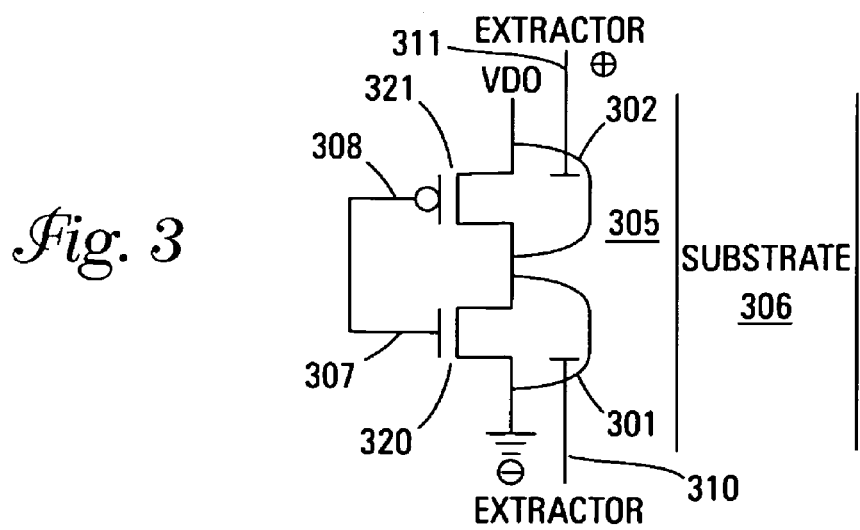
FIG. 3 shows a cross sectional view of a fully depleted silicon-on-insulator inverter using one embodiment of the reverse biased extractor contact method of the present invention.

FIG. 3 illustrates a cross sectional view of one embodiment of an SOI inverter using the reverse biased extractors of the present invention. The inverter is comprised of two transistors, an NMOS device 320 and a PMOS device 321. Each transistor 320 and 321 has an associated extractor contact 310 and 311. Each extractor 310 and 311 is coupled to the body structure 301 and 302 of each transistor. The NMOS body structure 301 is comprised of a p-type silicon while the PMOS body structure 302 is comprised of an n-type silicon.

Each transistor 320 and 321 has an associated control gate 307 and 308 respectively. The control gate 307 is located above the drain/source regions (not shown). The insulator 305 and substrate 306 are also illustrated.

The extractors 310 and 311 are reverse biased with respect to the substrate potential. To reverse bias the extractor 302 of the PMOS transistor 321, a voltage that is greater than the drain voltage, $V_{DD}$, is applied. The NMOS transistor's extractor 301 is reverse biased by applying a voltage that is less than ground potential.

In one embodiment, the additional voltages needed to bias the extractor nodes above $V_{DD}$ and below ground can be generated by charge pump circuits that are well known in the art. These pumps are not illustrated.

The extractor reverse biasing of the present invention changes the partially depleted SOI structure to fully depleted without a floating body region. Charge that is generated by leakage currents, impact ionization, or ionizing radiation is extracted and not collected on a floating body or near the source. Removal of any excess charge generated by leakage currents or impact ionization will be by diffusion current and not be drift along a highly resistive p-type body region.

Flash memories based on electron trapping are well known and commonly used electronic components. Smaller cell sizes have always been one of the more important issues for low bit cost and high density flash memory. Conventional planar NOR flash memory cells require a large number of contacts. NAND flash memories are a series of devices with contacts at the end of a long series of bits. This results in a very high bit density.

Nitride read only memory (NROM) flash memory devices employ charge trapping in a silicon nitride layer. NROM devices can be implemented with the CMOS process.

Figure 4:
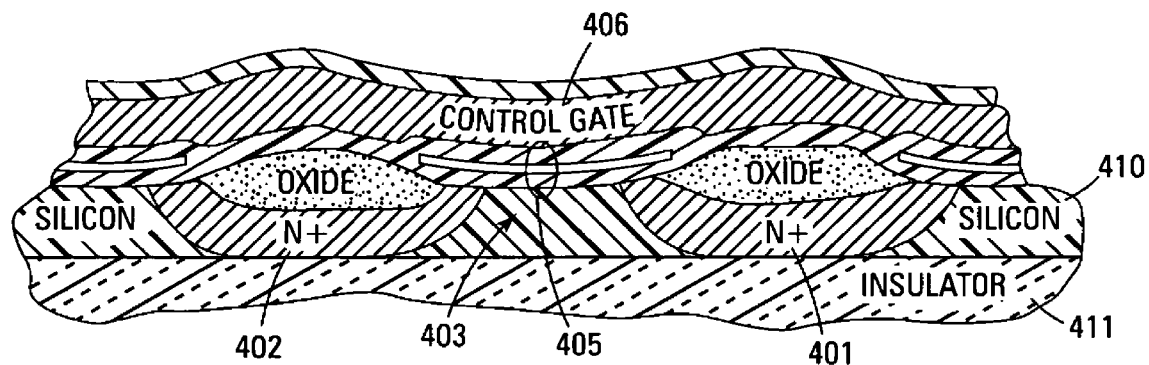
FIG. 4 shows a cross sectional view of an NROM flash memory cell using one embodiment of the method of the present invention to fully deplete silicon-on-insulator transistors.

SOI has recently been employed for NROM flash cells. FIG. 4 illustrates a cross sectional view of an NROM flash memory cell using one embodiment of the method of the present invention to fully deplete silicon-on-insulator transistors. The NROM flash memory cell of FIG. 4 is a NOR array cell with virtual ground bit lines.

The NROM flash memory cell is comprised of the SOI layer 410 on the insulator 411. The bit lines 401 and 402 are n-type regions in this embodiment. When the extractor contacts (shown in FIG. 5) are reverse biased, the body region 403 between the bit lines is fully depleted. The oxide-nitride-oxide (ONO) region 405 is between the control gate 406 and the silicon layer 410.

Figure 5:
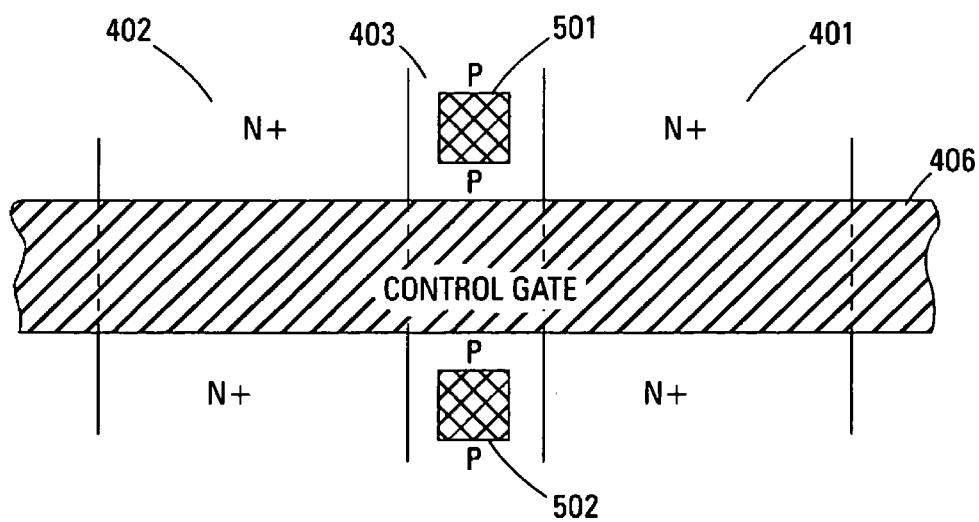
FIG. 5 shows a top view of the NROM flash memory cell of FIG. 4.

FIG. 5 illustrates a top view of the NROM flash memory cell of FIG. 4. This view shows the bit lines 401 and 402 and the control gate 406. The extractor contacts 501 and 502 are p-type regions over the depleted body 403.

Figure 6:
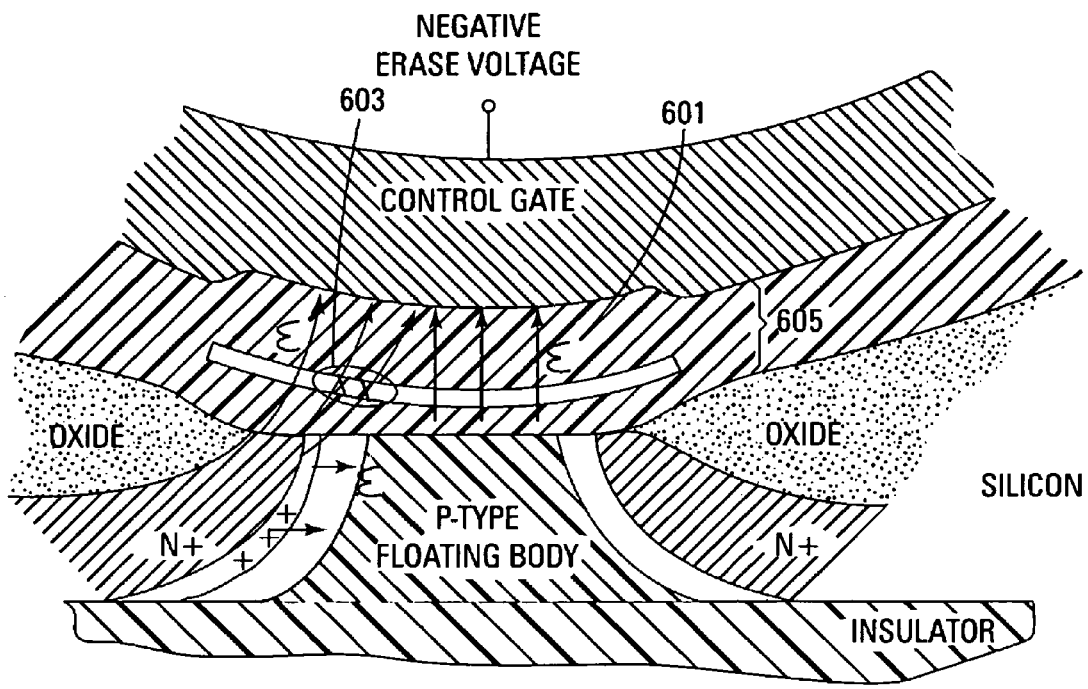
FIG. 6 shows a cross sectional view of a typical prior art partially depleted NROM flash memory cell.

One problem with typical partially depleted NROM flash memory cells is that the floating body causes a problem during an erase operation. When a negative erase potential is applied to the control gate in an NROM device, the partially depleted body terminates many of the electric field lines as illustrated in the cross sectional view of FIG. 6. In this case, the body potential floats negative causing the electric field 601 that is attempting to erase the charge 603, stored in the ONO composite gate insulator 605, to become smaller and the erase speed slower.

The extractor reverse biasing method of the present invention can be applied to an NROM flash memory cell to increase erase speed. Additionally, the erase speed will not drift and change with time due to floating body effects as occurs in partially depleted devices.

Figure 7:
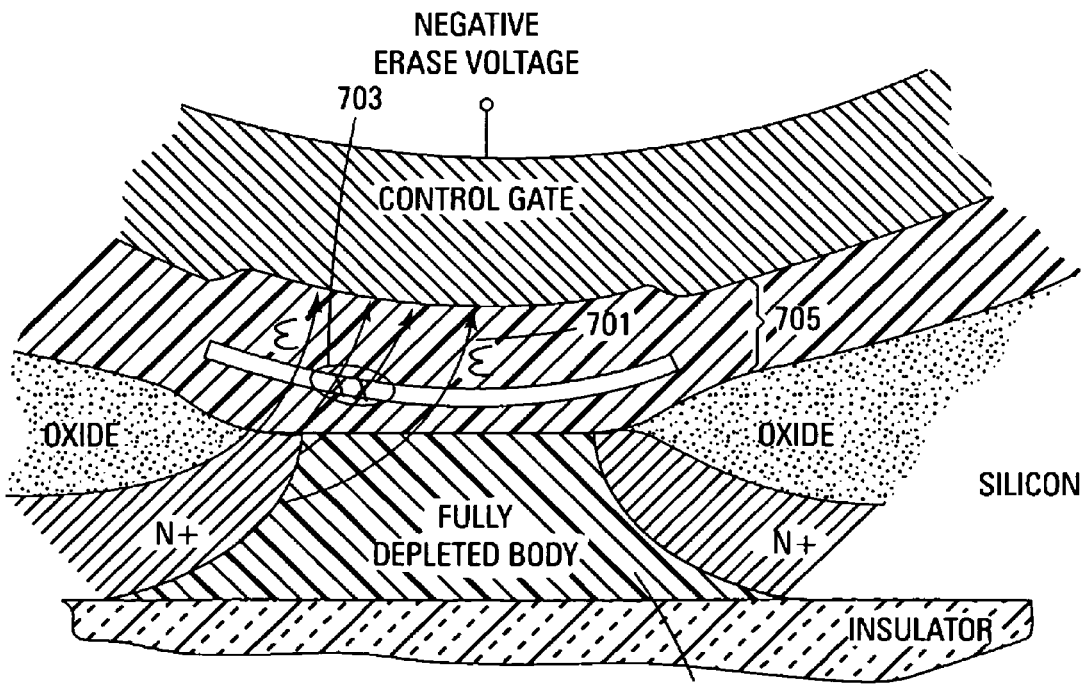
FIG. 7 shows a cross sectional view of a fully depleted NROM flash memory cell using one embodiment of the extractor contact reverse bias method of the present invention.

FIG. 7 illustrates a cross sectional view of an NROM flash memory cell that uses one embodiment of the method of the present invention for fully depleting silicon-on-insulator transistors. The charge 703 stored in the ONO layer 705 is erased by the electric field 701 without a drift in the erase speed. The fully depleted body 710 does not have a negative effect on the electric field 701 as in a partially depleted device.

While the embodiments of FIGS. 4-7 illustrate NROM flash memory cells, alternate embodiments may use conventional flash memory cells on SOI. If there is a floating body, the negative control gate potential couples through the floating gate to the floating body. The floating body then changes to a negative potential. This decreases the electric field used for negative control gate to source erase, thus slowing the erase operation. The fully depleted SOI transistor bodies of the present invention eliminate this effect.

Figure 8:
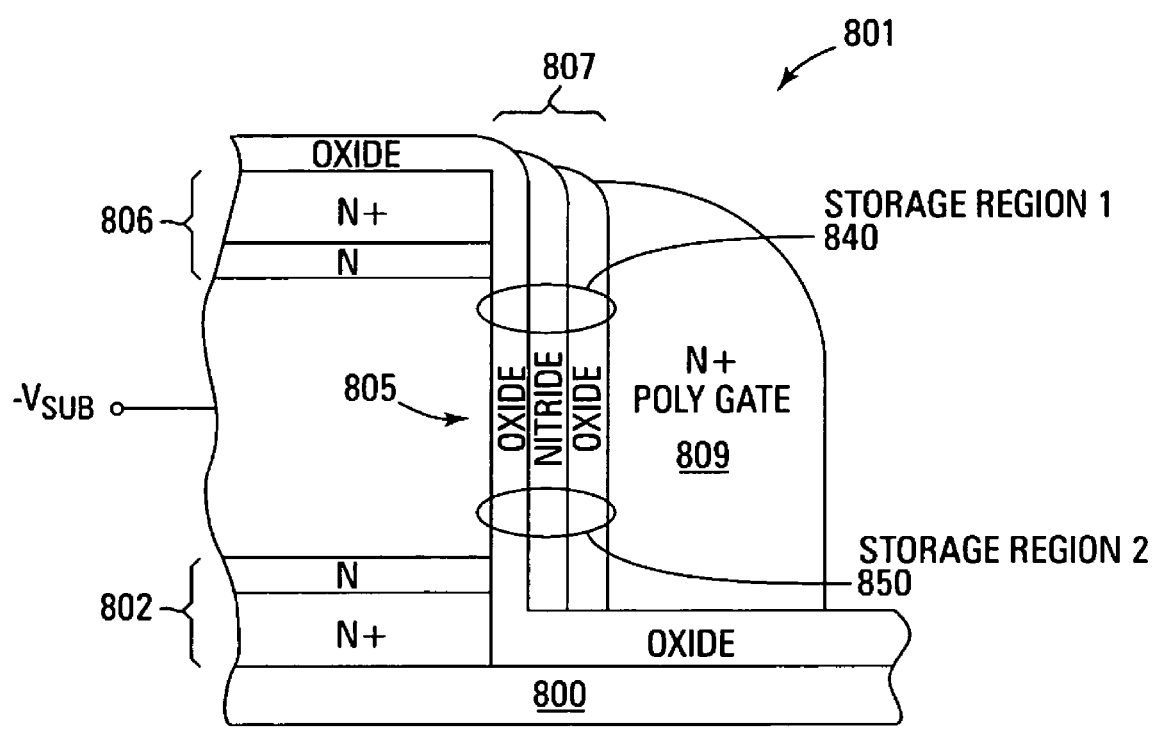
FIG. 8 shows a cross sectional view of a fully depleted vertical NROM flash memory cell using one embodiment of the extractor contact reverse bias method of the present invention.

FIG. 8 illustrates a vertical NROM 301 that can use the reverse biased extractors of the present invention to produce a fully depleted body structure. As shown in FIG. 8, the vertical NROM 801 includes a vertical metal oxide semiconductor field effect transistor (MOSFET) 801 extending outwardly from a substrate 800. The MOSFET 801 has a first source/drain region 802 that, in this n-channel embodiment, includes a heavily doped (n+) n-type region layered with an n-type doped region. The MOSFET 801 includes a similarly structured second source/drain region 806.

A channel region 805 is located in the vertical pillar between the first and the second source/drain regions, 802 and 806 respectively. As shown in the embodiment of FIG. 8, a gate 809 is separated from the channel region 805 by a gate insulator 807 as is located alongside of the vertical pillar opposing the channel region 805.

In the embodiment shown in FIG. 8, the gate insulator 807 includes a gate insulator formed of an oxide-nitride-oxide (ONO) composition 807. In alternative embodiments, discussed below, the gate insulator 807 includes a gate insulator selected from the group of silicon dioxide ($SiO_2$) formed by wet oxidation, silicon oxynitride (SON), silicon rich oxide (SRO), and silicon rich aluminum oxide ($Al_2O_3$). In one embodiment, the gate insulator 807 has a thickness of approximately 10 nanometers (nm).

In other embodiments, the gate insulator 807 includes a gate insulator 807 selected from the group of silicon rich aluminum oxide insulators, silicon rich oxides with inclusions of nanoparticles of silicon, silicon oxide insulators with inclusions of nanoparticles of silicon carbide, and silicon oxycarbide insulators. In still other embodiments, the gate insulator 807 includes a composite layer selected from the group of an oxide-aluminum oxide ($Al_2O_3$)-oxide composite layer, an oxide-silicon oxycarbide-oxide composite layer, and an oxide-nitride-aluminum oxide composite layer.

The aluminum oxide top layer has a higher dielectric constant so that this layer can be thicker in order to preclude tunneling to and from the control gate to the nitride storage layer. Alternate embodiments use other high dielectric constant insulators as the top layer.

In still other embodiments, the gate insulator 807 includes a gate insulator 807 that includes a composite layer, or a non-stoichiometric single layer of two or more materials selected from the group of silicon (Si), titanium (Ti), and tantalum (Ta).

Figure 9:
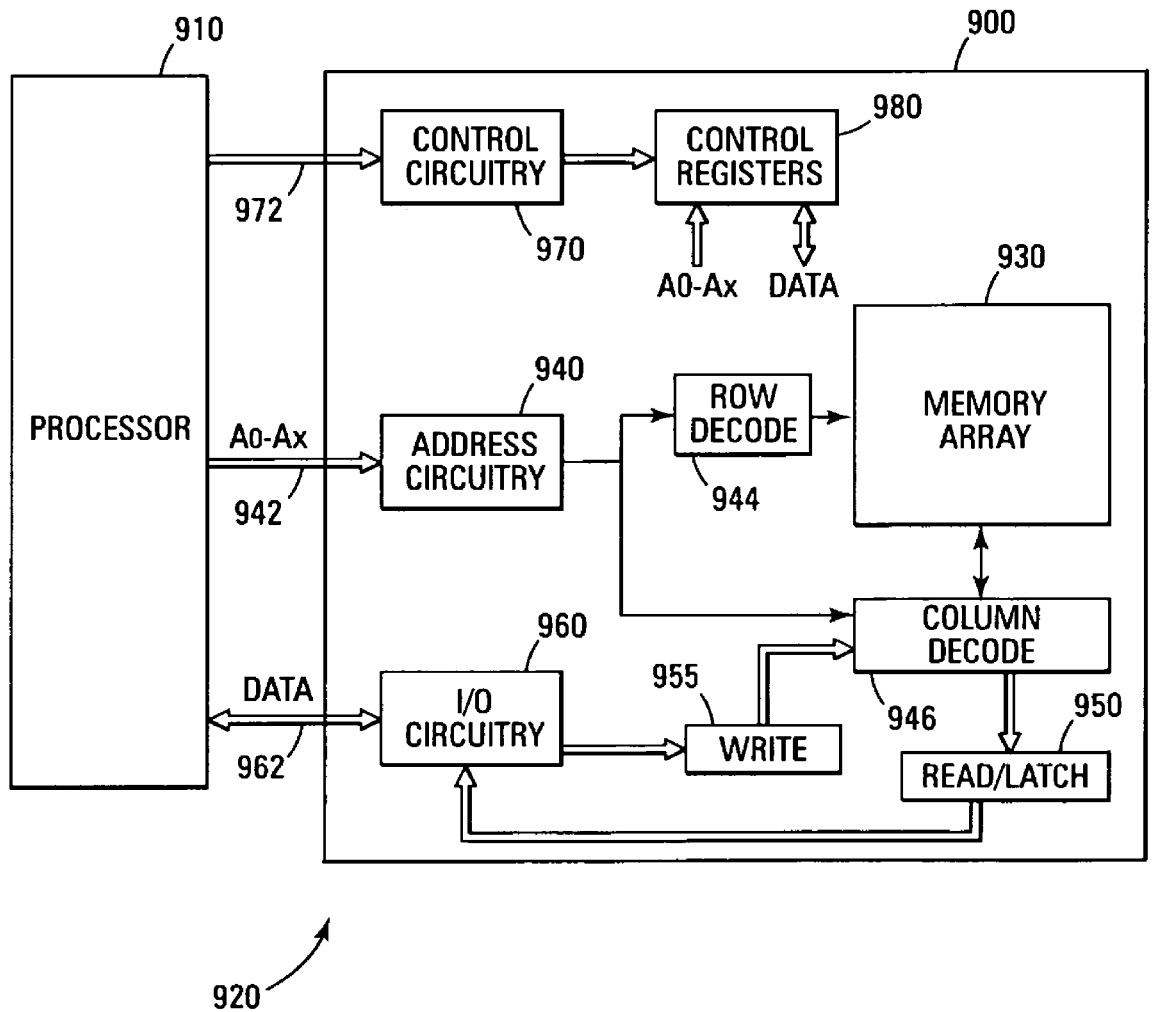
FIG. 9 shows an electronic system in accordance with a fully depleted silicon-on-insulator transistor of the present invention.

FIG. 9 illustrates a functional block diagram of a memory device 900 coupled to a processor 910 and incorporating one embodiment of an SOI memory cell of the present invention. The processor 910 may be a microprocessor, a processor, or some other type of controlling circuitry. The memory device 900 and the processor 910 form part of an electronic system 920.

The memory device includes an array of SOI-structured memory cells 930 as described in the various embodiments above. In one embodiment, the memory cells are non-volatile floating-gate memory cells and the memory array 930 is arranged in banks of rows and columns.

An address buffer circuit 940 is provided to latch address signals provided on address input connections A0-Ax 942. Address signals are received and decoded by a row decoder 944 and a column decoder 946 to access the memory array 930. It will be appreciated by those skilled in the art, with the benefit of the present description, that the number of address input connections depends on the density and architecture of the memory array 930. That is, the number of addresses increases with both increased memory cell counts and increased bank and block counts.

The memory device 900 reads data in the memory array 930 by sensing voltage or current changes in the memory array columns using sense/latch circuitry 950. The sense/latch circuitry, in one embodiment, is coupled to read and latch a row of data from the memory array 930. Data input and output buffer circuitry 960 is included for bi-directional data communication over a plurality of data connections 962 with the controller 910. Write circuitry 955 is provided to write data to the memory array.

Control circuitry 970 decodes signals provided on control connections 972 from the processor 910. These signals are used to control the operations on the memory array 930, including data read, data write, and erase operations. The control circuitry 970 may be a state machine, a sequencer, or some other type of controller.

The flash memory device illustrated in FIG. 9 has been simplified to facilitate a basic understanding of the features of the memory. A more detailed understanding of internal circuitry and functions of flash memories are known to those skilled in the art.

CONCLUSION

In summary, floating body effects in partially depleted CMOS devices using SOI technology are undesirable in many logic and memory applications. In static CMOS logic and SRAM memories, the floating bodies cause threshold voltages and switching speeds to be variable and complex functions of the switching history of a particular logic gate. In dynamic logic DRAM memories, the floating bodies cause excess charge leakage and short retention times that can result in data loss. Conventional flash memories and NROM memories experience reduced erase fields and slower erase times due to floating bodies. The use of reverse biased extractors of the present invention, resulting in fully depleted body structures, substantially reduces or eliminates these undesirable effects.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory array comprising:
    a plurality of transistors each having a silicon-on-insulator on a substrate, each transistor comprising:
        a drain region comprising a first doped material and formed in the silicon-on-insulator;
        a source region comprising the first doped material and formed in the silicon-on-insulator;
        an oxide-nitride-oxide layer formed on the silicon-on-insulator between the drain region and the source region;
        a control gate formed on the oxide-nitride-oxide layer and substantially between the drain and source regions; and
        an extractor contact, in the silicon-on-insulator, comprising a second doped material and coupled to a depletion region substantially between the drain and source regions, the depletion region being fully depleted in response to a reverse bias of the extractor contact;
    wherein pairs of adjacent transistors of the plurality of transistors, each comprising a different conductivity type from the other transistor of the pair, are coupled together in parallel, source region to drain region, such that their control gates are connected.

2. The array of claim 1 wherein the first doped material is comprised of n-type silicon and the second doped material is comprised of p-type silicon.

3. The array of claim 1 wherein the first doped material is comprised of p-type silicon and the second doped material is comprised of n-type silicon.

4. The array of claim 1 wherein the extractor contact is coupled to a p-type silicon of the silicon on the insulator.

5. The array of claim 1 wherein the extractor contact is coupled to an n-type silicon of the silicon on the insulator.

6. A memory array comprising:
    a plurality of transistors each having a silicon-on-insulator on a substrate, each transistor comprising:
        a drain region formed in the silicon-on-insulator;

a source region formed in the silicon-on-insulator;
an oxide-nitride-oxide layer formed on the silicon-on-insulator between the drain region and the source region;
a control gate formed on the oxide-nitride-oxide layer and substantially between the drain and source regions; and
an extractor contact, in the silicon-on-insulator coupled to a depletion region substantially between the drain and source regions, the depletion region configured to be fully depleted in response to a reverse bias of the extractor contact;
wherein pairs of adjacent transistors of the plurality of transistors, a first transistor comprising p-type silicon and a second transistor comprising n-type silicon, are coupled together in parallel, source region to drain region, such that their control gates are connected.

7. The memory array of claim 6 wherein at least one of the drain region or the source region are coupled to bit lines of the memory array.

8. The memory array of claim 6 wherein the memory array is coupled in a NAND configuration.

9. The memory array of claim 6 wherein the memory array is coupled in a NOR configuration.

10. The memory array of claim 6 wherein the drain region and the source region are comprised of n+ material and the extractor contact is a p+ material.

* * * * *